US012643432B2

(12) United States Patent　　　　(10) Patent No.:　US 12,643,432 B2
Mankowski et al.　　　　　　　　　　(45) Date of Patent:　Jun. 2, 2026

(54) SYSTEMS AND METHODS FOR MAINTAINING BATTERY HEALTH

(71) Applicant: Accelerated Systems Inc., Waterloo (CA)

(72) Inventors: Peter Mankowski, Cambridge (CA); Willem Jager, Cambridge (CA); Andrei Buin, Waterloo (CA); Lucas Coelho, Kitchener (CA); Daniel Hailu, Elmira (CA)

(*) Notice: Subject to any disclaimer, the term of this patent is extended or adjusted under 35 U.S.C. 154(b) by 532 days.

(21) Appl. No.: 17/574,530

(22) Filed: Jan. 12, 2022

(65) Prior Publication Data

US 2022/0219567 A1　　Jul. 14, 2022

Related U.S. Application Data

(60) Provisional application No. 63/179,502, filed on Apr. 25, 2021, provisional application No. 63/137,104, filed on Jan. 13, 2021.

(51) Int. Cl.
| | |
|---|---|
| *B60L 58/22* | (2019.01) |
| *B60L 50/60* | (2019.01) |
| *B60L 58/16* | (2019.01) |
| *G01R 31/3828* | (2019.01) |
| *H02J 7/52* | (2026.01) |

(52) U.S. Cl.
CPC ............... *B60L 58/22* (2019.02); *B60L 50/60* (2019.02); *B60L 58/16* (2019.02); *G01R 31/3828* (2019.01); *H02J 7/52* (2026.01)

(58) Field of Classification Search
CPC .... B60L 58/22; B60L 58/00–27; B60L 50/60; B60L 53/80; B60L 58/16; G01R 31/3828; G01R 31/39; H02J 7/0014; H02J 7/0013; H02J 7/0024; H02J 7/0025
See application file for complete search history.

(56) References Cited

U.S. PATENT DOCUMENTS

| | | | |
|---|---|---|---|
| 2010/0321025 A1* | 12/2010 | Lin ................... | H01M 10/4207 |
| | | | 324/427 |
| 2021/0399554 A1* | 12/2021 | Sherstyuk ............. | H02J 7/0014 |
| 2022/0285952 A1* | 9/2022 | Roy ................... | H01M 10/4257 |

* cited by examiner

*Primary Examiner* — Catherine T. Rastovski
*Assistant Examiner* — Brian Butler Geiss

(57) ABSTRACT

A method of maintaining a rechargeable battery pack having a plurality of rechargeable batteries. The method includes measuring charge-level for the rechargeable batteries; and selecting a first battery set including a donor battery having a high charge-level, and a recipient battery having a low charge-level that is less than the high charge-level of the donor battery. The method also includes: rebalancing the first battery set; measuring a rest profile of the recipient battery after rebalancing the first battery set; and determining battery health of the recipient battery based on at least the rest profile.

19 Claims, 9 Drawing Sheets

*Figure 2, Bus voltage, Virtual voltage, and current vs time from load test with one battery.*

*Figure 1, Internal Resistance vs SOC based on external meters.*

*Figure 3, Voltages and current vs time on tested battery.*

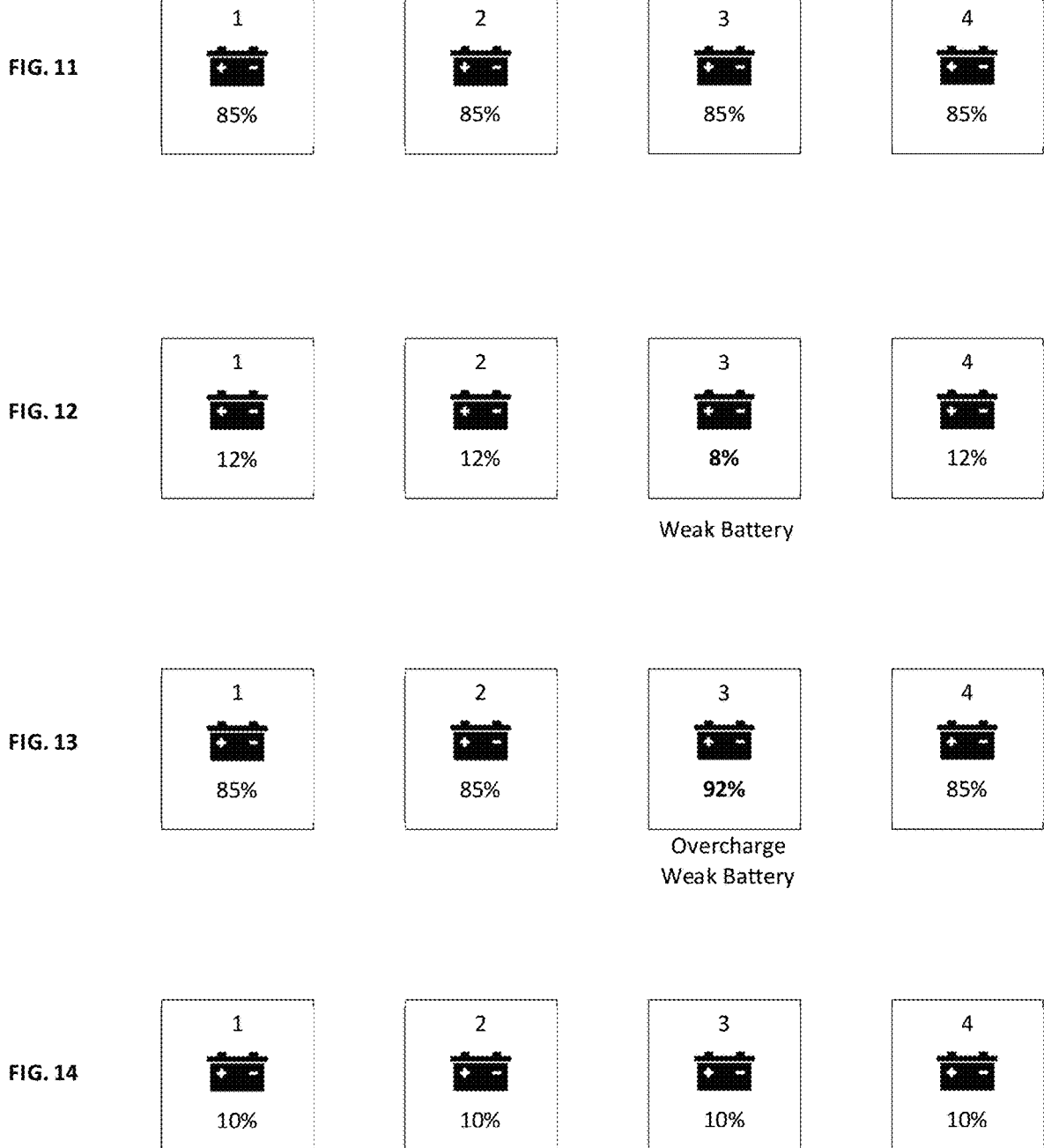

SYSTEMS AND METHODS FOR MAINTAINING BATTERY HEALTH

RELATED APPLICATIONS

This application claims priority to U.S. Provisional App. No. 63/137,104, filed Jan. 13, 2021 and entitled "Systems and Methods for Maintaining Battery Health", and U.S. Provisional App. No. 63/179,502, filed Apr. 25, 2021 and entitled "Systems and Methods for Maintaining Battery Health", the entire contents of which are hereby incorporated by reference herein for all purposes.

TECHNICAL FIELD

The embodiments herein relate to rechargeable batteries. More particularly, the embodiments herein relate to maintaining battery health of rechargeable batteries in a rechargeable battery pack for an electric vehicle.

INTRODUCTION

The following paragraphs are not an admission that anything discussed in them is prior art or part of the knowledge of persons skilled in the art.

Rechargeable batteries go through repeated cycles of loading and recharging. These continued cycles can impact battery health such as reductions in voltage, current, or charge capacity. Eventually, the rechargeable battery may deteriorate to a point where it can no longer function properly. At that point, the battery may be replaced. Unfortunately, new batteries can be expensive. This is particularly true for lithium-ion batteries used in electric vehicles.

An added complication is that the lifespan of a rechargeable battery is difficult to predict. Two batteries from the same manufacturer with the same general specifications may deteriorate at different rates. This can even happen when the batteries are used within a battery pack and the batteries are subjected to similar loading and recharging cycles. This may be because the individual batteries may have a different internal chemistry and impedance, which may lead to uneven charging and discharging. These imbalances can place some batteries within a battery pack under higher demand than other batteries, which can lead to premature deterioration and reduce overall battery life.

SUMMARY

One general aspect includes a method of maintaining a rechargeable battery pack having a plurality of rechargeable batteries. The method includes measuring charge-level for the rechargeable batteries; and selecting a first battery set including a donor battery having a high charge-level, and a recipient battery having a low charge-level that is less than the high charge-level of the donor battery. The method also includes: rebalancing the first battery set; measuring a rest profile of the recipient battery after rebalancing the first battery set; and determining battery health of the recipient battery based on at least the rest profile.

The rest profile may be measured for at least 5-minutes after rebalancing the recipient battery. The rest profile may be measured after completing at least one charge pulse.

The battery health may be further determined based on a virtual voltage. The virtual voltage may be calculated based on battery bus voltage and internal battery resistance. The battery health may be further determined based on measured charge capacity.

The battery health may be determined using a data model. The data model may be trained based at least one of charge-level, virtual voltage, and rest profile. The data model may be stored on a cloud computing system. The cloud computing system may store the battery health of the recipient battery.

The recipient battery may be recharged using a recharging profile determined based on the battery health of the recipient battery. The recharging profile may include a recharge duty cycle and a time constant. The method may include measuring a recharge current between the donor battery and the recipient battery, and the recharge duty cycle may be increased when the recharge current is less than a first current threshold.

The method may include calculating an expected rebalancing current between the donor battery and the recipient battery, and initiating the rebalancing if the expected rebalancing current is between 0.2-amps and 60-amps.

The method may include selecting a second battery set including one of the donor battery and the recipient battery, and a third battery. The method may include rebalancing the second battery set.

One general aspect includes a battery management system for a rechargeable battery pack including a plurality of rechargeable batteries. The battery management system may include: a communication module for detecting charge-level of the rechargeable batteries; and a battery controller for selecting a first battery set including a donor battery having a high charge-level, and a recipient battery having a low charge-level that is less than the high charge-level of the donor battery. The battery controller may rebalance the first battery set. The communication module may measure a rest profile of the recipient battery after rebalancing the first battery set. The battery controller may determine battery health of the recipient battery based on at least the rest profile.

The battery management system may include an external charger sensor for detecting an external charging source for recharging the rechargeable batteries. The battery controller may disengage the rebalancing when the external charger sensor detects the external charging source.

The communication module may detect battery statistics for each of the rechargeable batteries, and the battery controller may log the battery statistics. The battery controller may compare current battery statistics and prior battery statistics to identify changes in each rechargeable battery. The battery controller may determine an expected battery life for each battery based on the battery statistics. The battery controller may update the expected battery life periodically.

One general aspect includes a method of maintaining a rechargeable battery pack having a plurality of rechargeable batteries. The method may include: receiving battery health data for each of the rechargeable batteries; identifying a weak battery having a low battery health; and determining desired a recharge level for each of the rechargeable batteries based on the battery health data and a target depletion level after use of the rechargeable batteries. The desired recharge level includes an overcharge amount for the weak battery. The method may include recharging the rechargeable batteries to the desired recharge levels.

The target depletion levels may be within a target depletion range. The target depletion range may be between 10% and 15%.

The battery health data of each rechargeable battery may include a depletion profile from prior usage of the rechargeable battery during operation. The overcharge amount may be calculated by comparing the depletion profiles of the rechargeable batteries.

Implementations of the described techniques may include hardware, a method or process, or computer software on a computer-accessible medium. Other embodiments include corresponding computer systems, apparatus, and computer programs recorded on one or more computer storage devices, each configured to perform the actions of the methods.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

Other aspects and features will become apparent, to those ordinarily skilled in the art, upon review of the following description of some exemplary embodiments.

BRIEF DESCRIPTION OF THE DRAWINGS

The drawings included herewith are for illustrating various examples of articles, methods, and apparatuses of the present specification. In the drawings:

FIG. 11 is schematic diagram of a battery pack showing charge levels of four batteries after being charged.

FIG. 12 is schematic diagram of the battery pack of FIG. 11 showing charge levels after being depleted during operation.

FIG. 13 is schematic diagram of the battery pack of FIG. 11 showing charge levels after being recharged according to the method of FIG. 10.

FIG. 14 is schematic diagram of the battery pack of FIG. 13 showing charge levels after being depleted during operation.

DETAILED DESCRIPTION

Various apparatuses or processes will be described below to provide exemplary embodiments. No embodiment described below limits any claimed invention and any claimed invention may cover processes or apparatuses that differ from those described below. The claimed inventions are not limited to apparatuses or processes having all of the features of any one apparatus or process described below or to features common to multiple or all of the apparatuses described below. It is possible that an apparatus or process described below is not an embodiment of any claimed invention. Any invention disclosed below that is not claimed in this document may be the subject matter of another protective instrument, for example, a continuing patent application, and the applicants, inventors or owners do not intend to abandon, disclaim or dedicate to the public any such invention by its disclosure in this document.

Some embodiments herein describe systems and methods to maintain battery health. This may include rebalancing the batteries when operation stops, and loads are removed. Rebalancing the batteries may help keep batteries under similar loading when the batteries are operating under load.

Some embodiments herein describe systems and methods to predict battery health and expected battery life. For example, expected battery life may be determined by monitoring certain battery statistics after rebalancing or recharging the battery.

Figure 1:
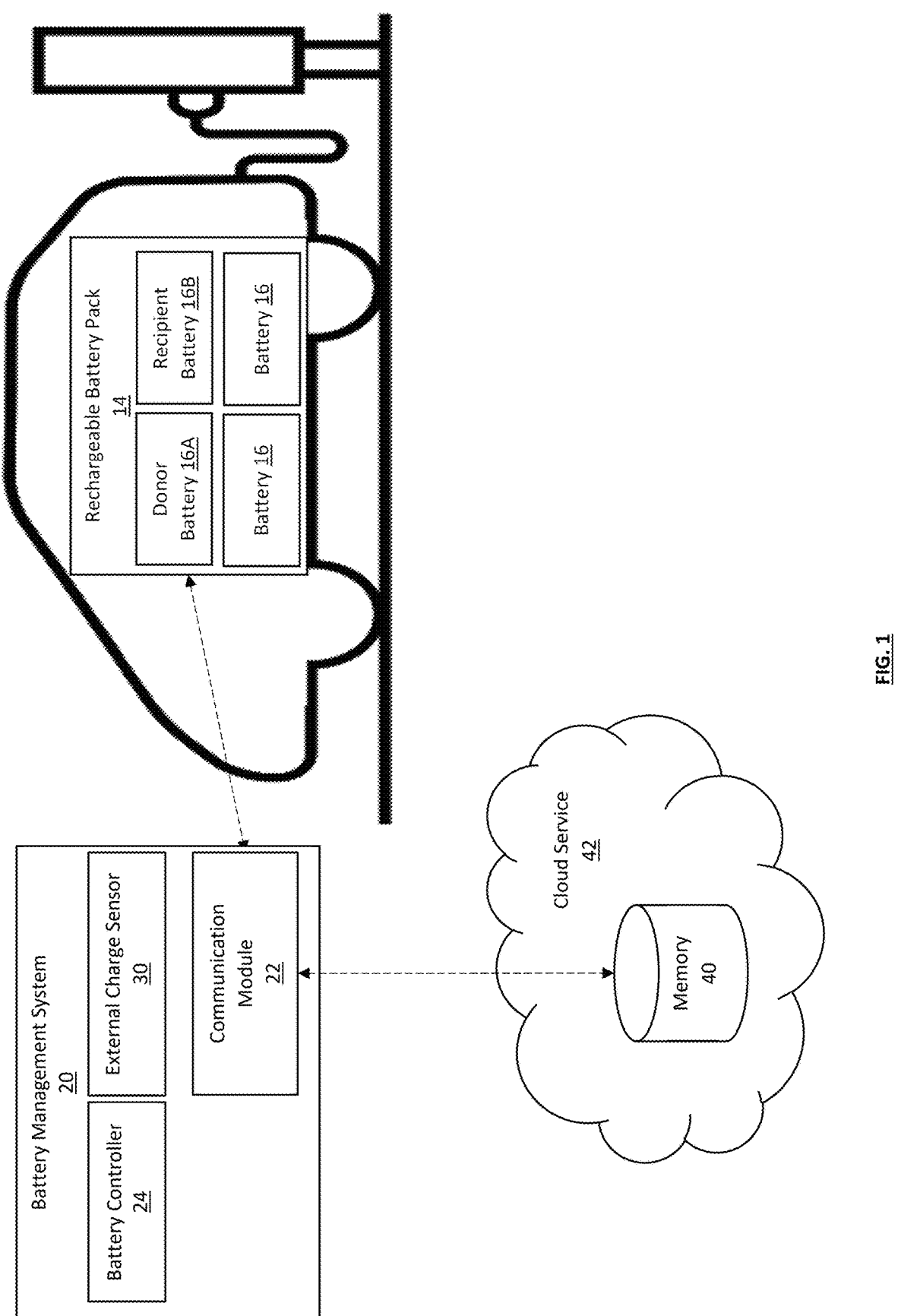
FIG. 1 is a schematic diagram of a battery management system for an electric vehicle.

Referring to FIGS. 1, there is a schematic diagram of an electric vehicle 10. The electric vehicle 10 includes a battery pack 14 with a plurality of rechargeable batteries 16, such as lithium-ion batteries or nickel-metal-hydride batteries. The electric vehicle 10 may be a car, a golf cart, a riding lawn mower, or another vehicle having wheels powered by the rechargeable batteries 16.

The batteries 16 may have similar characteristics. For example, the batteries 16 may have the following characteristics:

Nominal voltage: 48.1 [VDC]

Voltage at full charge: 54.6 [VDC]

Voltage at depletion: 41.6 [VDC]

Internal charge capacity: 1.49 [kWh]

Internal charge capacity: 31.2 [Ah]

Maximum peak discharge current: 150 [A] for 10 seconds

Maximum continuous discharge current: 80 [A]

Maximum regen (input) current: 80 [A] for 5 seconds

Maximum continuous charge current: 12 [A]

Referring again to FIG. 1, there is also a battery management system 20 for maintaining the battery pack 14. The battery management system 20 includes a communication module 22 and a battery controller 24. The battery controller 24 may use the communication module 22 to monitor various battery statistics of the battery pack 14 and the batteries 16. For example, the battery controller 24 may use the communication module 22 to identify each battery 16 with a battery identification number, and may monitor battery statistics such as voltage, current, or charge level of each battery 16.

In some embodiments, the communication module 22 may be part of the electric vehicle 10. For example, the communication module 22 may be part of a Controller Area Network (CAN) bus. During normal operation of the electric vehicle 10, the CAN bus may be operated by a Vehicle Control Module (VCM). When the electric vehicle 10 is turned off, the VCM may transfer operation of the CAN bus to the battery controller 24 through a handshake protocol or another state-change process.

In other embodiments, the communication module 22 may integrated as part of the battery management system 20, and separate from the electric vehicle 12.

During operation, the electric vehicle 10 may consume power from the batteries 16 at different rates. After operation, the batteries 16 may have a different charge level or open circuit voltage (OCV). In some cases, the batteries 16 may be charged from an external power source. In other cases, the batteries may be left idle until their next use. When idle, the battery management system 20 may rebalance the batteries 16 by transferring charge from higher charge/voltage batteries to lower charge/voltage batteries. For example, the battery management system 20 may detect charge-level or OCV of the batteries 16 using the communication module 22. The battery controller 24 may then select a set of batteries to rebalance based on the charge level or OCV. For example, the battery controller 24 may select a donor battery 16A having a high OCV, and a recipient battery 16B having a low OCV that is less than the OCV of the donor battery. In some examples, the difference in OCV may be at least 0.4V. The battery controller 24 may then rebalance the donor battery 16A and the recipient battery 16B, for example, by connecting the batteries together as shown in FIG. 2.

The battery controller 24 may actively manage the rebalancing process. For example, the battery controller 24 may implement the rebalancing method 100 shown in FIG. 3. At step 102, the battery controller 24 may calculate an expected rebalancing current using the following formula:

$$I_{BAL} = \frac{OCV_A - OCV_B}{R_{iA} + R_{iB}}$$

Figure 2:
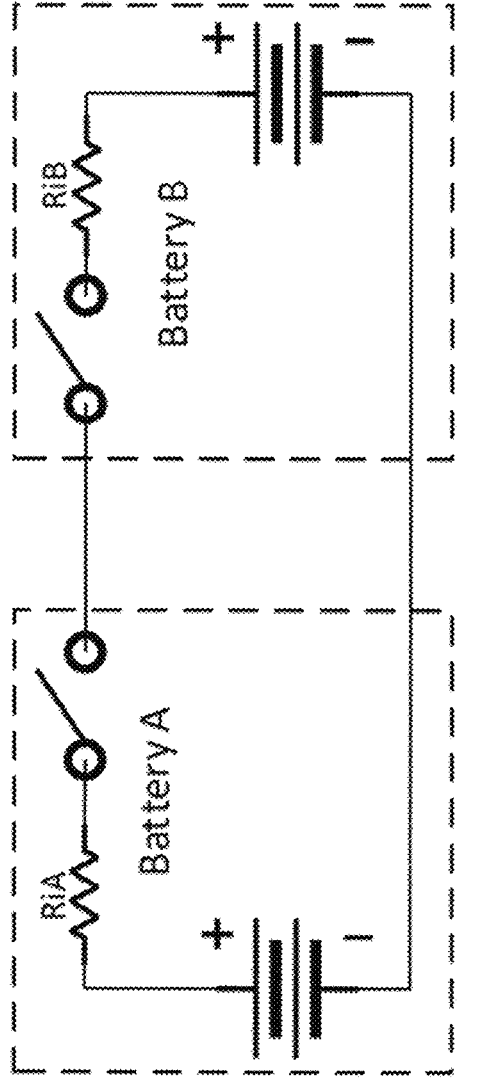
FIG. 2 is a schematic diagram of two batteries connected for rebalancing.

Where, with reference to FIG. 2:

$I_{BAL}$ is the calculated Rebalancing Current.

$OCV_A$ is the measured Open Circuit Voltage for the donor battery 16A.

$OCV_B$ is the measured Open Circuit Voltage for the recipient battery 16B.

$R_{iA}$ is the known Internal battery resistance for the donor battery 16A.

$R_{iB}$ is the known Internal battery resistance for the recipient battery 16B.

Figure 3:
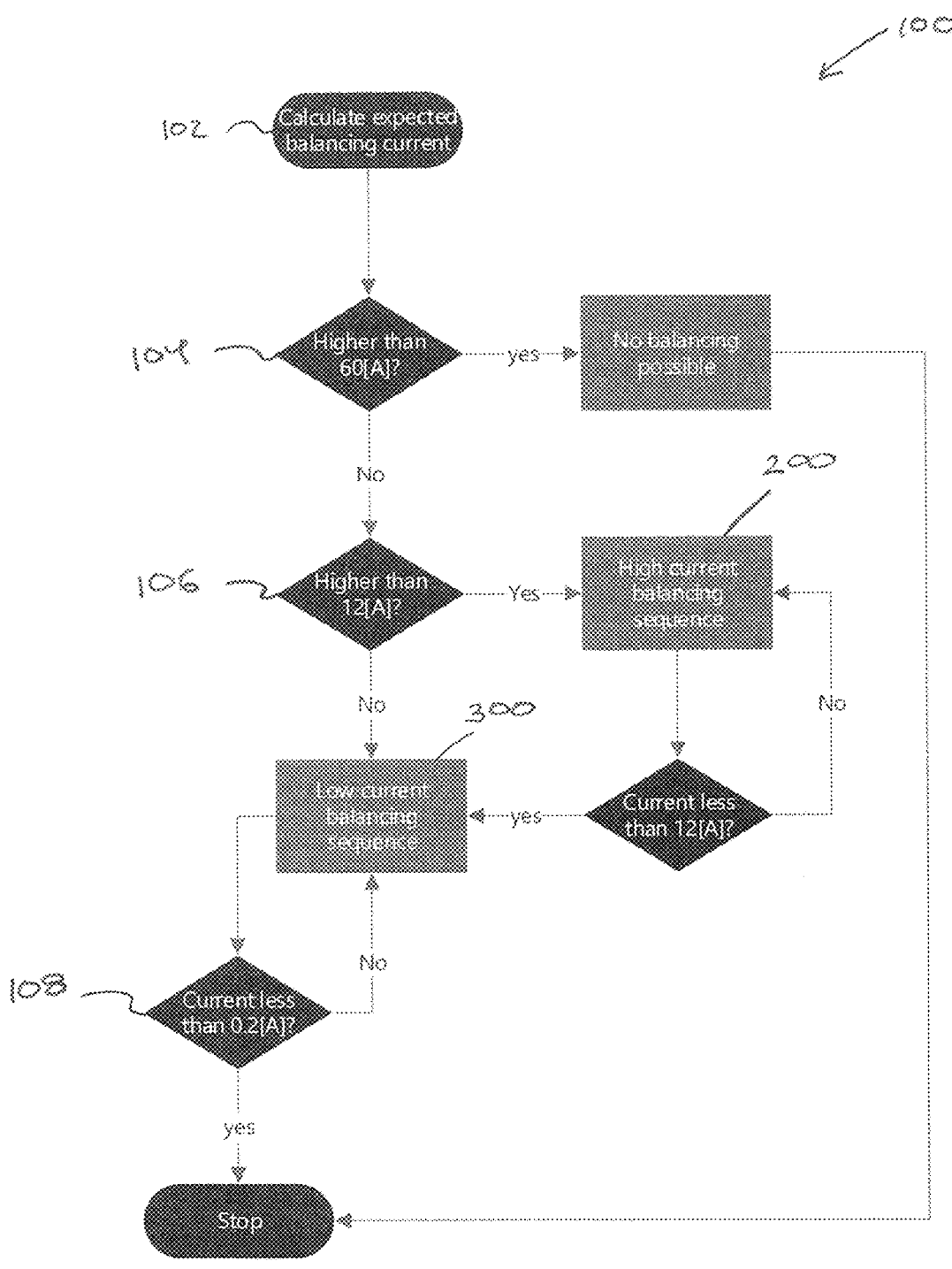
FIG. 3 is a flow chart illustrating a method of rebalancing batteries.

Referring to FIG. 3, the battery controller 24 may perform different functions depending on the calculated rebalancing current. For example, at step 104, if the rebalancing current exceeds a safety threshold (e.g. above 60 A), the battery controller 24 may stop rebalancing. At step 106, if the rebalancing current is between an intermediate threshold and the safety threshold (e.g. between 12 A to 60 A), then the battery controller 24 may select a high-current balancing mode 200. If the rebalancing current is less than the intermediate threshold (e.g. less than 12 A), then the battery controller 24 may select a low-current balancing mode 300. At step 108, if the rebalancing current is less than a minimum threshold (e.g. 0.2 A), then the battery controller 24 may stop rebalancing.

Figure 4:
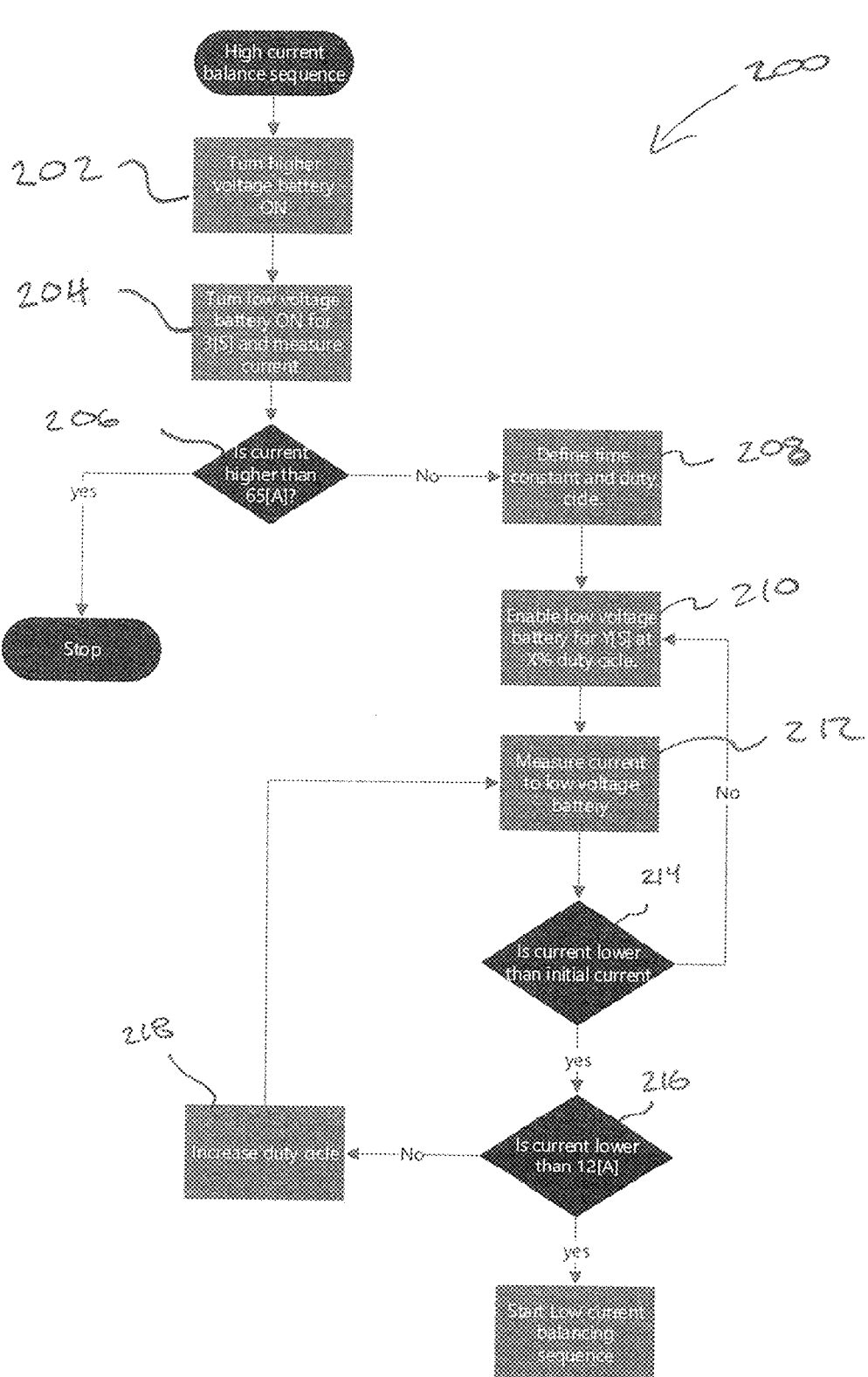
FIG. 4 is a flow chart illustrating a high-current charging mode for rebalancing batteries.

The high-current balancing mode 200 will now be described with reference to FIG. 4. At step 202, the battery controller 24 turns on the donor battery 16A. At step 204, the battery controller 24 turns on the recipient battery 16B for an initial test. At step 206 the battery controller 24 checks if the charging current is below a certain level, such as a maximum threshold (e.g. 65 A). If the charging current exceeds that level, then the battery controller 24 may stop the rebalancing method 100.

In some embodiments, the battery controller 24 may allow the recipient battery 16B to rest between bursts of high charging current. For example, at step 208, the battery controller 24 may calculate a pulse duration corresponding to a duty cycle and time constant. At step 210, the battery controller 24 may begin rebalancing by enabling the recipient battery 16B for the calculated pulse duration (e.g. 3-seconds) based on the duty cycle and time constant. For example, the duty cycle may be 25% and the time constant may be 12-seconds. The pulse duration may be selected in a manner that prolongs battery life.

During rebalancing, the charging current may reduce over time. Accordingly, the battery controller 24 may measure the charging current periodically. For example, at step 214 the battery controller 24 checks if the charging current has dropped below the charging current of the prior measurement, which may be the charging current from the previous charging pulse. If the new charging current remains at or above the prior measurement, then the battery controller 24 completes another charging pulse at step 210. If the charging current has dropped at step 214, then the battery controller 24 checks if the charging current is below the intermediate threshold (e.g. 12 A) at step 216. If the charging current has dropped, but remains above the intermediate threshold, then the battery controller 24 may increase the duty cycle at step 218. For example, the duty cycle may be increased from 25% to 50%. If the charging current is below the intermediate threshold, then the battery controller 24 may switch to the low-current balancing mode 300.

Figure 5:
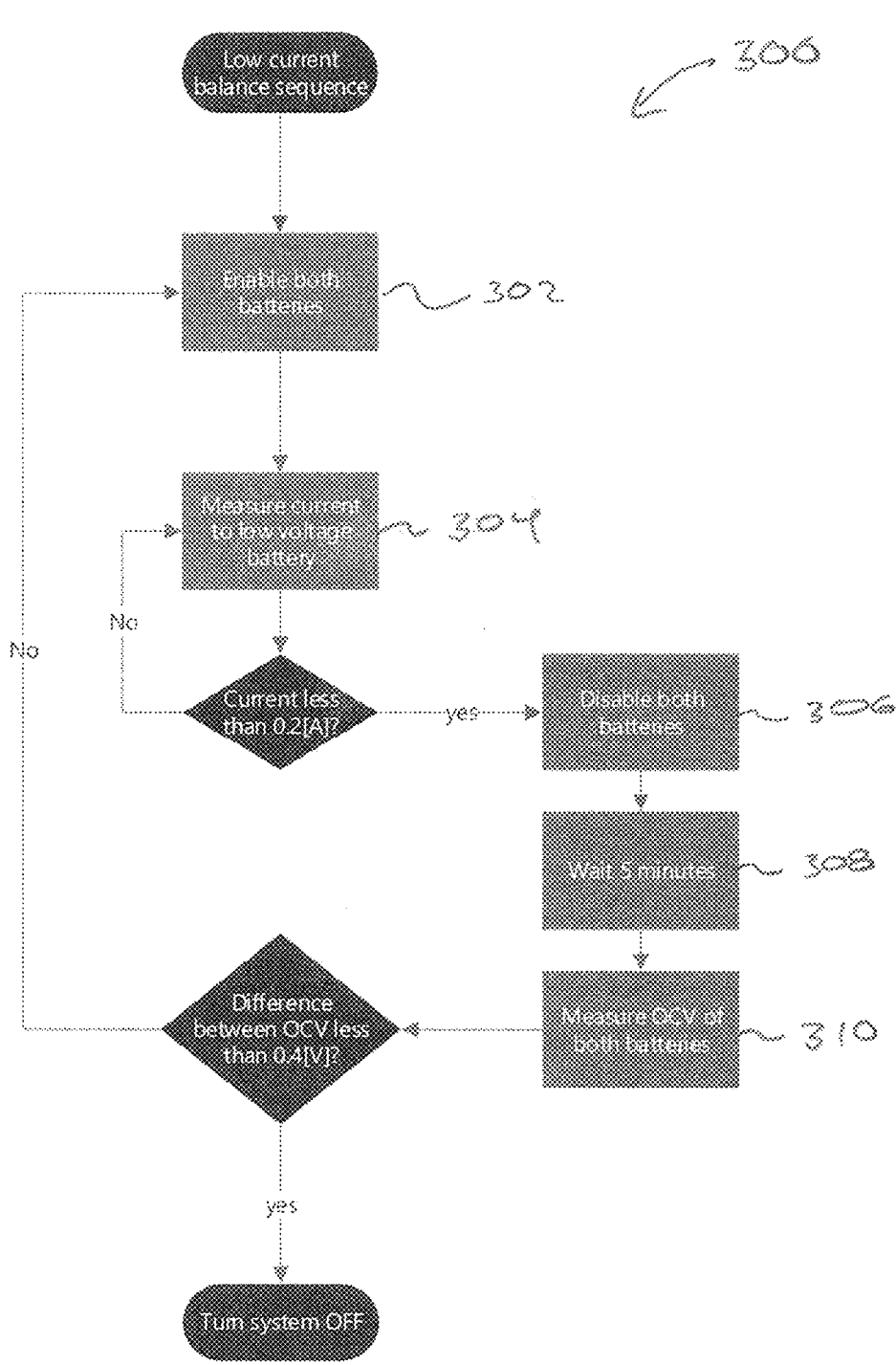
FIG. 5 is a flow chart illustrating a low-current charging mode for rebalancing batteries.

The low-current balancing mode 300 will now be described with reference to FIG. 5. At step 302, the battery controller 24 enables the donor battery 16A and the recipient battery 16B. This enables the low-current rebalancing. During rebalancing, the charging current may reduce over time. Accordingly, at step 304 the battery controller 24 checks if the charging current is below a certain level, such as the minimum threshold (e.g. 0.2 A). When the charging current is below that level, the battery controller 24 disables both the donor battery 16A and the recipient battery 16B at step 306, and waits for a rest period 308 (e.g. 5-minutes). After the rest period, the battery controller 24 measures the OCV for both batteries at step 310. If the OCV of the batteries exceeds a certain voltage differential (e.g. 0.4V), then the battery controller 24 enables the donor battery 16A and the recipient battery 16B at step 302 to continue rebalancing. If the OCV of the batteries are within that voltage differential, then the battery controller 24 stops the low-current balancing mode 300.

The battery controller 24 may rebalancing the batteries 16 in stages. The battery controller 24 may start with the high-current balancing mode 200 and then switch to the low-current balancing mode 300. This may help reduce the amount of high-current charging and/or prolong battery life.

In some embodiments, the battery controller 24 may rebalance the batteries 16 in a certain order. For example, the battery controller 24 may measure the OCV for the batteries 16 and calculate the expected charging current between the two batteries with similar voltages, such as the two highest voltage batteries. The battery controller 24 may rebalance those two batteries 16 according to the method 100 using the high-current balancing mode 200 and/or the low-current balancing mode 300. Afterward, the next highest voltage battery may be rebalanced. In some embodiments, the donor battery 16A may be a single battery or a group of batteries, such as the batteries that were previously rebalanced. Selecting the order of batteries 16 for rebalancing may help prolong battery life.

Once the batteries are rebalanced, the battery controller 24 may wait a rest period (e.g. 5-minutes) and re-check the OCV for the batteries. If there is a voltage differential above a certain threshold (e.g. 0.4V), the battery controller 24 may perform further rebalancing.

Referring again to FIG. 1, the battery management system 20 may include an external charger sensor 30 for detecting an external charging source for recharging the batteries 16. The battery controller 24 may disengage the rebalancing method 100 when the external charger sensor 30 detects the external charging source.

The battery controller 24 may perform other functions as well. In some embodiments, the battery controller 24 may check if the batteries 16 are compatible with each other. For example, before starting operation of the electric vehicle 10, the battery controller 24 may check if the OCV of the batteries 16 are within an operational range (e.g. within 1.0V of each other).

The battery controller 24 may also check battery compatibility during operation of the electric vehicle 10. However, during operation, the voltage of the battery 16 may tend drop and may indicate a battery 16 is incompatible even though the OCV would otherwise be within the operation range of the other batteries if the load were removed. Accordingly, the battery controller 24 may calculate a "virtual voltage" for the batteries 16 under load. The virtual voltage is the calculated OCV of a battery 16 under load according to the following formula:

$$V_{virtual}=V_{bus}+(R_i*I)$$

Figure 6:
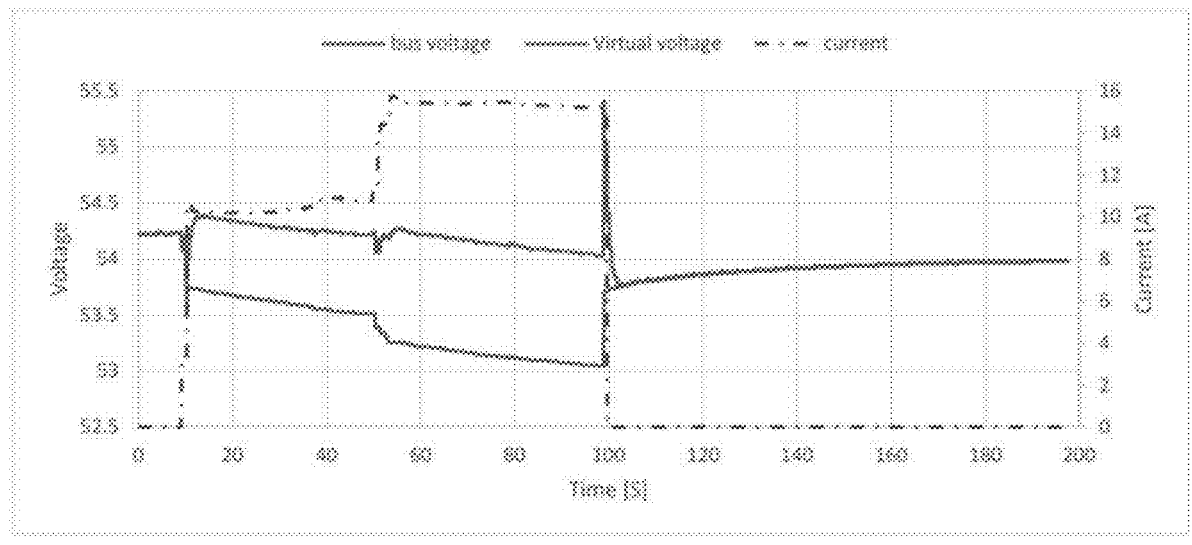
FIG. 6 is a graph showing virtual voltage and current versus time for a battery under load.

Where:

$V_{Virtual}$ is the Virtual Voltage $V_{Bus}$ is the measured Battery Bus Voltage under load I is the measured Battery Current $R_i$ is the Internal battery resistance for the battery Virtual voltage may be subject to instantaneous spikes or noise, especially during a transient phase when initially placing the battery under load. An example of this transient phase is shown in FIG. 6. Accordingly, the battery controller 24 may average virtual voltage over time. For example, the battery controller 24 may use the communication module 22 to measure the battery bus voltage and battery current periodically (e.g. every 500 ms), and calculate the average virtual voltage (e.g. over 10 samples). This may help reduce the impact of instantaneous spikes or noise.

Use of the virtual voltage can be beneficial if a battery 16 briefly loses communication during operation and becomes disabled. Once disabled, the OCV of the disabled battery may gradually rise above the bus voltage of the remaining batteries under load, and the batteries 16 may appear to fall outside the operation range (e.g. within 1V of each other). Nevertheless, if the disabled battery were to be enabled, it may function properly if it has an OCV within the operation range of the other batteries. Accordingly, the battery controller 24 may calculate the virtual voltage of the batteries 16 under load and compare the calculated virtual voltages to the OCV of the disabled battery. If they are within the operation range, then the battery controller 24 may re-enable the disabled battery.

Figure 7:
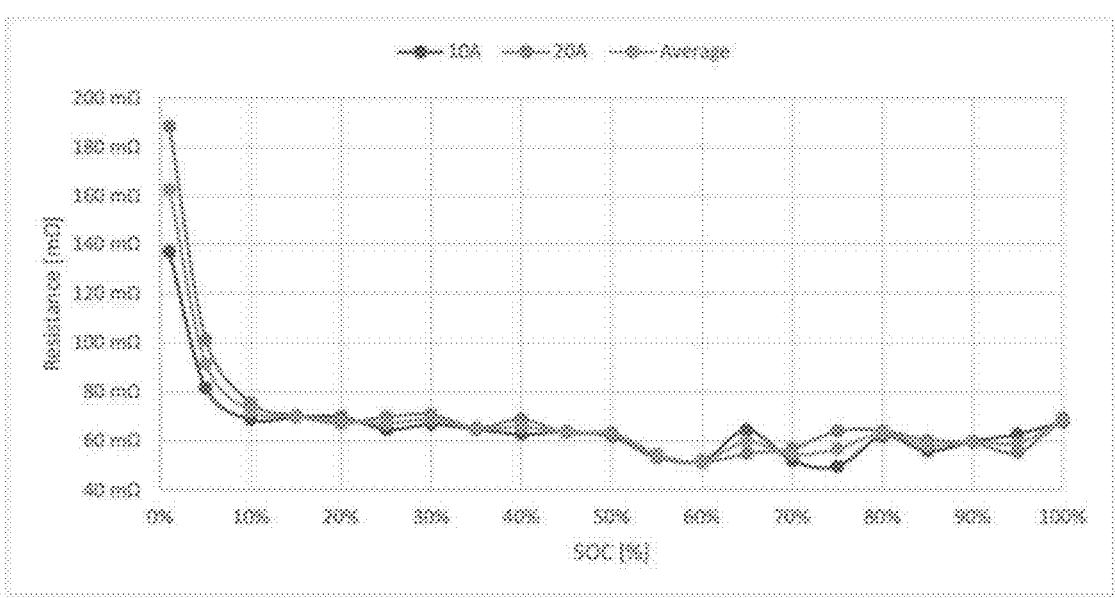
FIG. 7 is a graph showing internal battery resistance versus charge level for a battery.

Over time, the internal battery resistance of the batteries 16 may change. This may impact calculation of the virtual voltage, or calculated rebalancing current for the rebalancing method 100. Accordingly, the battery controller 24 may update the internal battery resistance of each battery 16 periodically. For example, with reference to FIG. 7, the internal battery resistance may be updated as the charge level changes (also referred to as "State of Charge" or "SOC"). The correlation between internal battery resistance and charge level may be measured over the first recharge cycle, or may be calculated according to a data model.

In some embodiments, the battery controller 24 may update the internal battery resistance for a battery 16 if the OCV and virtual voltage differ by more than a certain amount. For example, a difference of more than 0.5 VDC between the OCV and virtual voltage may trigger the battery controller 24 to update the internal battery resistance for the battery 16.

Referring again to FIG. 1, the communication module 22 may monitor battery statistics for each battery 16, such as charge-level, charge capacity, and virtual voltage. The battery controller 24 may log those battery statistics. For example, the battery statistics may be stored in memory 40. As shown, the memory 40 may be part of a cloud service 42 such as Amazon Web Services (AWS™). The memory 40 could also be integrated onboard with the battery management system 20 or as part of the electric vehicle 10.

In some embodiments, the battery controller 24 may compare current battery statistics with prior battery statistics stored in the memory 40 to identify changes in each battery 16. This may help identify degradation of a battery, malfunctioning batteries, or when a battery has been replaced with a new battery. The battery controller 24 may disable the battery 16 if battery statistics are outside normal operating parameters.

In some embodiments, the battery controller 24 may determine battery health. Battery health may be an estimate of battery life such as an indication of the number of recharge cycles remaining before the battery significantly loses its original characteristics such as nominal voltage, voltage at full charge, voltage at depletion, charge capacity, peak discharge current, and other characteristics. The battery controller 24 may predict battery health or expected battery life based on certain battery statistics, as will be described below.

Rechargeable batteries such as lithium-ion batteries may exhibit a slow charge capacity degradation up to a knee-point, after which the degradation may accelerate rapidly until the end-of-life for the battery. In some embodiments, the battery controller 24 may predict the knee-point as an indicator of battery health. In some embodiments, the knee-point may be calculated based on capacity degradation data and capacity fade curves.

In some examples, the knee-point may be the maximum curvature. In some examples, the knee-point may be the intersection of two tangent lines to the capacity fade curve drawn at two significant points such an inflection-point and the point of maximum-slope-changing-ratio. For example, in FIG. 8, there is capacity degradation curves for batteries at four temperatures (10° C., 25° C., 45° C., and 60° C.). The inflection-points are shown as squares, the points of maximum-slope-changing-ratio are shown as triangles, and the identified knee-points are shown as circles.

In some examples, the knee-point may be calculated using a quantile regression model. For example, a median regressor line may be fit to battery health data from one or more batteries, and the knee-point may be defined as the first point at which the battery health data is outside a safety zone around the median regression line. For nickel-manganese-cobalt, the knee-point may be between 90-95% battery health.

Figure 8:
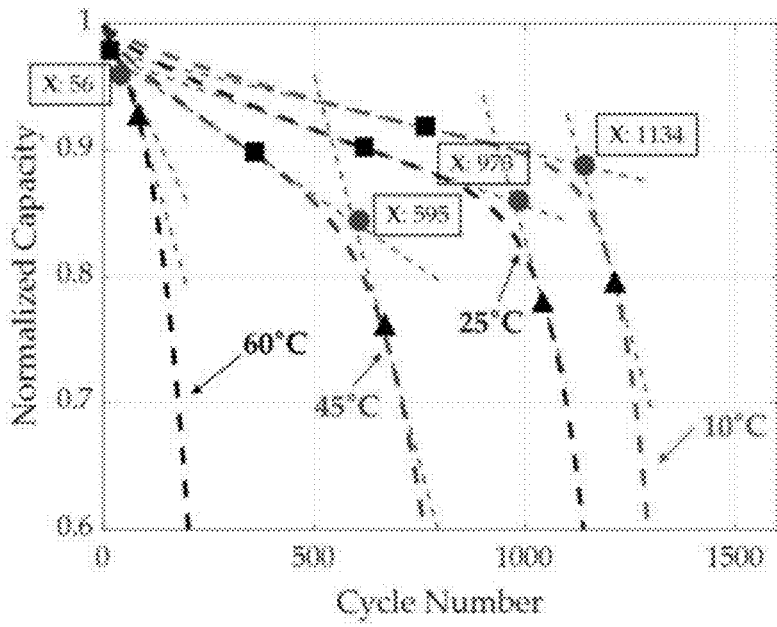
FIG. 8 is a graph showing knee-points on capacity degradation curves for batteries at four different temperatures.

As shown in FIG. 8, battery degradation may occur at a generally linear rate leading up to the knee-point. At the knee-point, there may be a fast rate of non-linear degradation. Just before the knee-point, there may be a slower rate of non-linear, which may be referred to as "knee-onset". In some cases, the battery controller 24 may predict the knee-onset as an indicator of battery health.

In some embodiments, the battery controller 24 may use a combination of knee-point and knee-onset to indicate battery health. For example, a battery with high-charge-rate cycling (1C-8C, corresponding to fully charged and discharged within 60-minutes to 7.5-minutes respectively) may have an average knee-point occurring at 95% charge capacity under, and an average knee-onset occurring at 97.1% charge capacity, with the knee-point and knee-onset occurring an average of 108 cycles apart. In some examples, battery health may be correlated to knee-point and knee-onset quantitatively with 9.4% error using information from the first 50 cycles of the battery. The battery health may be used to predict the expected battery life as short, medium or long with approximately 90% accuracy using information from the first 3-5 cycles of the battery.

Figure 9:
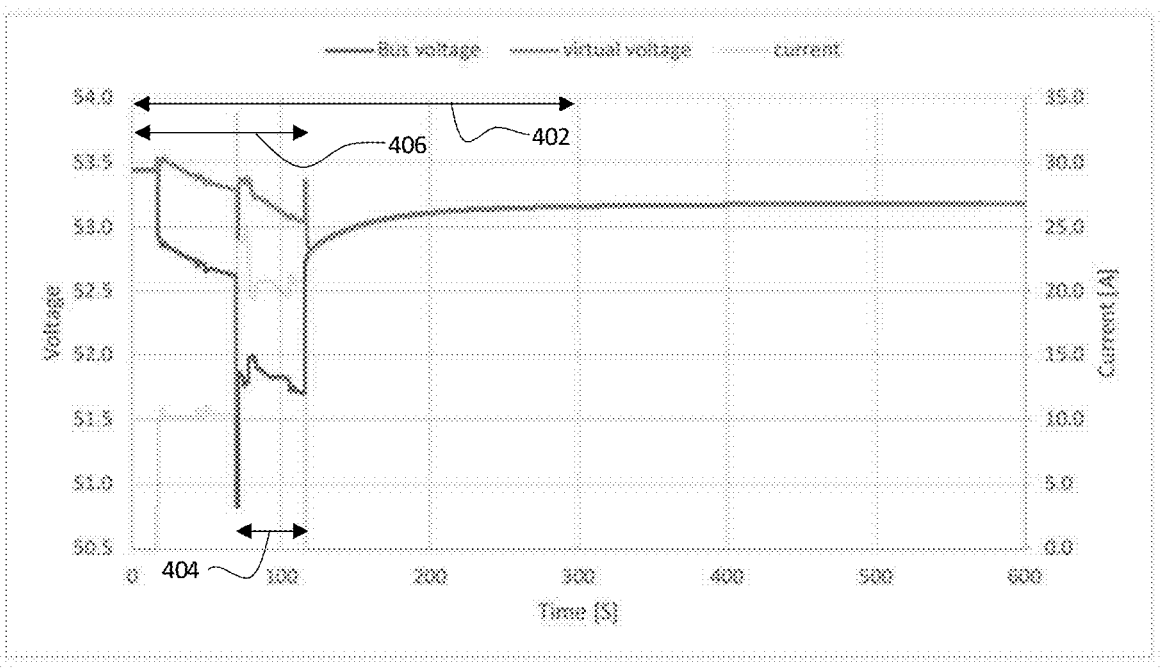
FIG. 9 is a graph showing a rest profile for a battery including changes in current, bus voltage, and virtual voltage over time.

In some examples, battery health may be predicted based on rest profile. The rest profile may be monitored after rebalancing the battery 16 or charging the battery 16 from an external power source. For example, FIG. 9 shows a rest profile 400 of the recipient battery 16B after being under load. Certain features of the rest profile 400 may indicate battery health. For example, the battery health may be correlated to the duration of the transient phase 402, the time between peaks 404, the elapsed time to the recovery knee 406, and other aspects of the rest profile 400.

The rest profile 400 may be measured for a rest duration. In some embodiments, the rest duration may be at least 5-minutes after rebalancing, charging, or loading the battery 16. This may allow the transient phase 402 to fully complete.

The rest profile 400 may be measured periodically. For example, the rest profile 400 may be measured after external charging, after rebalancing, or after one or more charge pulses during rebalancing.

In some embodiments, the battery controller 24 may determine battery health based on other battery statistics, such as charge-level, charge capacity, and virtual voltage.

In some embodiments, the battery controller 24 may use a data model to determine the battery health. For example, a dataset including battery health and statistics such as knee-point, knee-onset, rest profile, charge-level, charge capacity, and virtual voltage may be stored in memory. The dataset may include statistics for multiple batteries over time. Machine learning techniques may be used to generate models that correlate battery health to the battery statistics from the dataset. For example, the data model may be based on an adaptive discrete sliding mode observer artificial intelligence model, or a recurrent neural network. The dataset and the data model may be stored in the memory 40 on the cloud service 42.

Monitoring battery health can be used to predict future charge capacity loss and expected battery life. In some embodiments, the battery controller 24 may use the battery health to actively manage the battery 16. This may include setting performance parameters for operation under load, external charging, and rebalancing. For example, the battery controller 24 may select a recharging profile for each battery 16 based on the currently determined battery health. For example, battery controller 24 may select a specific recharge duty cycle and recharge period for each battery. This may prolong battery life.

In some embodiments, the battery controller 24 may update the battery health and/or expected battery life periodically. For example, the battery controller 24 may send a request to the cloud service 42 to calculate the current battery health and expected battery life based on current battery statistics. The updated battery health and expected battery life may be used to adjust battery management such as recharge profiles, or proactively plan for battery maintenance such as replacement of the battery.

Figure 10:
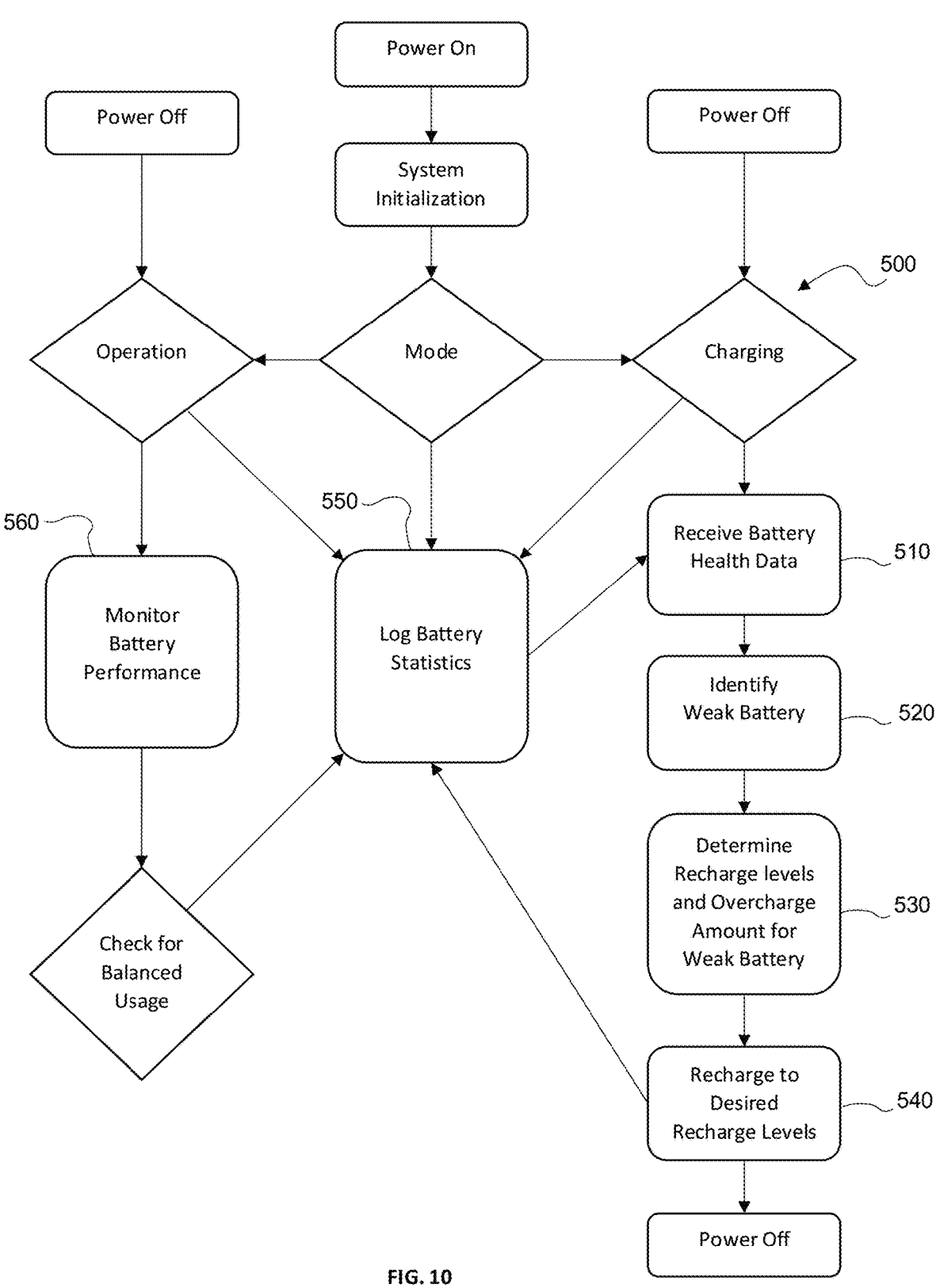
FIG. 10 is a flow chart illustrating a method of another charging mode for rebalancing batteries.

Referring now to FIG. 10, there is a flow chart depicting another method 500 for maintaining a rechargeable battery pack. The method 500 may be used to compensate for a weak battery having a lower battery health than other rechargeable batteries. In such cases, it may be desirable to overcharge one or more weak batteries so that the batteries have similar charge levels once fully depleted after operation.

Step 510 includes receiving battery health data for each of the rechargeable batteries. For example, the battery management system 20 may receive battery health data stored from the cloud service 42, or memory integrated onboard with the battery management system 20 or as part of the electric vehicle 10.

Step 520 includes identifying a weak battery having low battery health. For example, the battery controller 24 may compare the battery health for each of the batteries and may identify one or more batteries with lower health compared to the other batteries. For example, the weak battery may be identified based on knee-point, knee-onset, rest profile, charge-level, charge capacity, virtual voltage, expected battery life, depletion profiles, or a combination of one or more factors. The battery health data may be collected at step 550 by logging data over multiple operation and recharge cycles.

Step 530 includes determining desired recharge levels for the rechargeable batteries based on the battery health data and target depletion levels after use of the rechargeable batteries. The desired recharge levels also include an overcharge amount for the weak battery based on the battery health data compared to the other rechargeable batteries. The overcharge amount sets the recharge level of the weak battery higher than the recharge levels of the other batteries. The overcharge amount may be selected so that the target depletion level after operation will be the similar for all of the batteries in the battery pack. This may promote more balanced usage of the batteries during operation.

The target depletion levels may be selected to be within a target depletion range. The target depletion range may help achieve certain operating performance, or may help prolong battery health. In some embodiments, the target depletion range may be between 10% and 15%.

The desired recharge levels may be calculated using a data model. For example, the data model may be based on actual recharge levels and depletion levels from prior operation and recharge cycles. The data model may also incorporate battery health data. In some examples, machine learning techniques may be used to generate models that correlate the desired recharge level to target depletion levels. The recharge data model may be stored on the cloud service 42.

Step 540 includes recharging the rechargeable batteries to the desired recharge levels. In some examples, recharging may be completed using an external charging source, or using the rebalancing method 100 described above. In some examples, the battery controller 24 actively manage the recharging of each battery. For example, the battery controller 24 may select a recharging profile for each battery based on the currently determined battery health and the target depletion level. For example, battery controller 24 may select a specific recharge duty cycle and recharge period for each battery.

One example of the method 500 will now be described with reference to FIG. 11 to FIG. 14. As shown in FIG. 11 there are four batteries. Each battery is charged to 85%. During operation, the batteries may be depleted. As shown in FIG. 12, battery #3 is depleted to 8% and the other batteries are depleted to 12%. In this case, the battery controller 24 may determine that battery #3 is a weak battery relative to the other batteries. During step 530, the battery controller 24 may have a target depletion level of about 10%. Based on this, the battery controller 24 may calculate that battery #3 should be overcharged to 92% and the desired recharge level of the other batteries should be 85%. The calculation may be completed using a recharge data model stored on cloud service 42. In FIG. 13, the batteries are recharged to the desired recharge levels. In FIG. 14, the depletion level after operation is 10% for all four batteries.

As indicated above, the depletion profile may be a factor used to determine battery health. The depletion profile may be determined based on the recharge level prior to operation, and the depletion level after operation. In some examples, the depletion profile may be measured periodically during operation of the batteries at step 560 in FIG. 10. This may provide more detail on the rate of depletion for the batteries. The periodic measurement may also be used to update the data models for calculating the recharge levels and overcharge amount.

While some embodiments herein may refer to rechargeable batteries for electric vehicles, the teachings may be applied to other rechargeable batteries.

In the preceding description, for purposes of explanation, numerous details are set forth in order to provide a thorough understanding of the embodiments. However, it will be apparent to one skilled in the art that these specific details may not be required. In other instances, well-known structures are shown in block diagram form in order not to obscure the understanding. For example, specific details are not provided as to whether some of the embodiments described herein are implemented as a software routine running on a processor via a memory, hardware circuit, firmware, or a combination thereof.

Embodiments of the disclosure or elements thereof can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

The invention claimed is:

1. A method of maintaining a rechargeable battery pack having a plurality of rechargeable batteries, the method comprising:
 a) measuring charge-level for the rechargeable batteries;
 b) selecting a first battery set including:
  i) a donor battery having a high charge-level; and ii) a recipient battery having a low charge-level that is less than the high charge-level of the donor battery;
 c) rebalancing the first battery set by transferring charge from the donor battery to the recipient battery;
 d) measuring a rest profile of the recipient battery after rebalancing the first battery set, the rest profile including measurement of a transient phase that begins after transferring charge from the donor battery to the recipient battery; and
 e) determining battery health of the recipient battery based on at least the transient phase of the rest profile;
 wherein the recipient battery is rebalanced using a recharging profile determined based on the battery health of the recipient battery.

2. The method of claim 1, wherein the rest profile is measured for at least 5-minutes after rebalancing the recipient battery.

3. The method of claim 1, wherein the rest profile is measured after completing at least one charge pulse.

4. The method of claim 1, wherein the battery health is further determined based on a virtual voltage.

5. The method of claim 4, wherein the virtual voltage is calculated based on battery bus voltage and internal battery resistance.

6. The method of claim 5, wherein the battery health is further determined based on measured charge capacity.

7. The method of claim 1, wherein the battery health is determined using a data model.

8. The method of claim 7, wherein the data model is trained based at least one of:
 a) charge-level;
 b) virtual voltage; and
 c) rest profile.

9. The method of claim 7, wherein the data model is stored on a cloud computing system.

10. The method of claim 1, wherein the recharging profile includes a recharge duty cycle and a time constant.

11. The method of claim 10, further comprising measuring a recharge current between the donor battery and the recipient battery, and wherein the recharge duty cycle is increased when the recharge current is less than a first current threshold.

12. The method of claim 1, further comprising calculating an expected rebalancing current between the donor battery and the recipient battery and initiating the rebalancing if the expected rebalancing current is between 0.2-amps and 60-amps.

13. The method of claim 1, further comprising
 a) selecting a second battery set including:
  i) one of the donor battery and the recipient battery; and
  ii) a third battery; and
 b) rebalancing the second battery set.

14. A battery management system for a rechargeable battery pack including a plurality of rechargeable batteries, the battery management system comprising:
 a) a communication module for detecting charge-level of the rechargeable batteries; and
 b) a battery controller for selecting a first battery set including:
  i) a donor battery having a high charge-level; and
  ii) a recipient battery having a low charge-level that is less than the high charge-level of the donor battery;
 c) wherein the battery controller rebalances the first battery set by transferring charge from the donor battery to the recipient battery, and the communication module measures a rest profile of the recipient battery after rebalancing the first battery set, the rest profile including measurement of a transient phase that begins after transferring charge from the donor battery to the recipient battery, and the battery controller determines battery health of the recipient battery based on at least the transient phase of the rest profile wherein the recipient battery is rebalanced using a recharging profile determined based on the battery health of the recipient battery.

15. The battery management system of claim 14, further comprising an external charger sensor for detecting an external charging source for recharging the rechargeable batteries, and wherein the battery controller disengages the rebalancing when the external charger sensor detects the external charging source.

16. The battery management system of claim 14, wherein the communication module detects battery statistics for each of the rechargeable batteries, and the battery controller logs the battery statistics.

17. The battery management system of claim 16, wherein the battery controller compares current battery statistics and prior battery statistics to identify changes in each rechargeable battery.

18. The battery management system of claim 16, wherein the battery controller determines an expected battery life for each battery based on the battery statistics.

19. A method of maintaining a rechargeable battery pack having a plurality of rechargeable batteries, the method comprising:

a) rebalancing the rechargeable batteries by transferring charge between the rechargeable batteries, measuring a rest profile for each of the rechargeable batteries after rebalancing the rechargeable batteries, the rest profile including measurement of a transient phase that begins after transferring charge from the donor battery to the recipient battery, determining battery health for each of the rechargeable batteries based on at least the transient phase of the rest profile;

b) identifying a weak battery having a low battery health;

c) determining a desired recharge level for each of the rechargeable batteries based on the battery health data and a target depletion level after use of the rechargeable batteries, and wherein the desired recharge level includes an overcharge amount for the weak battery; and d) recharging the rechargeable batteries to the desired recharge levels.

\* \* \* \* \*